United States Patent [19]
Ciardi

[11] Patent Number: 5,506,627
[45] Date of Patent: Apr. 9, 1996

[54] PHASE LOCKED LOOP CHAIN FOR LOCKING AUDIO SAMPLING TO SERIAL DIGITAL COMPONENT VIDE TIMING

[75] Inventor: John J. Ciardi, Beaverton, Oreg.

[73] Assignee: Tektronix, Inc., Wilsonville, Oreg.

[21] Appl. No.: 257,973

[22] Filed: Jun. 10, 1994

[51] Int. Cl.$^6$ ............................................. H04N 5/12
[52] U.S. Cl. ............................ 348/515; 348/536; 331/20
[58] Field of Search ................................. 348/497–499, 348/505, 510, 512–520, 536–549, 423, 462, 480–486, 735–738; 358/320–326; 375/371, 373, 375, 376; 331/20, 25, 17, 2; H04N 5/04, 5/06, 5/12

[56] References Cited

U.S. PATENT DOCUMENTS

| | | | |
|---|---|---|---|
| 4,429,332 | 1/1984 | Pargee, Jr. | 348/423 |
| 4,729,025 | 3/1988 | Yanase | 348/497 |
| 4,769,704 | 9/1988 | Hirai et al. | 348/516 |
| 4,812,783 | 3/1989 | Honjo et al. | 348/537 |
| 4,847,678 | 7/1989 | McCauley | 348/537 |
| 4,851,909 | 7/1989 | Noske et al. | 358/320 |
| 5,043,813 | 8/1991 | Christopher | 348/541 |

*Primary Examiner*—James J. Groody
*Assistant Examiner*—Michael H. Lee
*Attorney, Agent, or Firm*—Francis I. Gray

[57] ABSTRACT

A phase locked loop (PLL) chain for locking audio sampling to serial digital component video timing has a deserializer that recovers a video sample clock signal from a serial digital video signal, the deserializer including a wide bandwidth PLL. A tracking filter in the form of a narrow bandwidth PLL having a low pass filter function reduces the jitter in the video sample clock signal to produce a stable reference clock signal. The stable reference clock signal is input to an audio sample clock generator to produce a stable audio sample clock signal for extracting audio data from the serial digital video signal.

5 Claims, 1 Drawing Sheet

PHASE LOCKED LOOP CHAIN FOR LOCKING AUDIO SAMPLING TO SERIAL DIGITAL COMPONENT VIDE TIMING

BACKGROUND OF THE INVENTION

The present invention relates to extraction of audio data from a serial digital video signal, and more particularly to a phase locked loop chain for locking audio sampling to serial digital component video timing that reduces clock jitter to provide high resolution digitization of the audio data.

A serial digital video signal that conforms to the SMPTE 259M standard, for example, may include up to four channels of audio data. The clock for the serial digital video signal is inherent in the serial digital video signal, and is recovered from the serial digital video signal using a wide bandwidth phase locked loop. Any clock jitter is passed by the wide bandwidth phase locked loop. The recovered clock is then input to an audio sample clock generator to generate an audio sample clock using a second wide bandwidth phase locked loop. Any jitter input to the audio sample clock generator from the recovered clock appears in the audio sample clock.

Digitization of audio to sixteen (16) bits of resolution, for example, requires an audio sample clock with peak to peak jitter in the 100 picosecond (ps) range. However often the recovered clock has a jitter content much greater than 100 ps. This results in distortion of the audio signal generated by the audio data.

What is desired is a phase locked loop chain for locking audio sampling to serial digital component video timing that reduces clock jitter to provide high resolution recovery of the audio data from a serial digital video signal.

SUMMARY OF THE INVENTION

Accordingly the present invention provides a phase locked loop chain for locking audio sampling to serial digital component video timing by inserting a crystal oscillator (VCXO) based tracking filter between a video clock recovery wide bandwidth phase locked loop and an audio sample clock generator wide bandwidth phase locked loop. The crystal oscillator based tracking filter is in the form of a very narrow bandwidth phase locked loop that exhibits a low pass filter response. The crystal oscillator has a nominal output frequency that is the same as the recovered clock frequency input to an input phase detector. The phase difference between the recovered clock frequency and the crystal oscillator frequency generates an error signal that is input to a loop filter to generate a voltage control signal. The voltage control signal adjusts the crystal oscillator frequency to match the recovered clock frequency. The low pass filter response of this phase locked loop is a function of the phase detector gain, the VCXO gain and the loop filter time constants. Additionally a multiplexer may be inserted between the loop filter and the VCXO. The multiplexer has the loop filter voltage control signal as one input and a precision, adjustable voltage source as a second input. So long as the serial digital video signal is present, an output from the video clock recovery circuit selects the output of the loop filter as the voltage control signal for the VCXO. However should there be a drop out of the serial digital video signal, then the multiplexer selects the precision voltage source as the voltage control signal for the VCXO. The precision voltage source is adjusted while the serial digital video signal is present so that the VCXO maintains a relatively constant reference clock frequency for the audio sample clock generator during such drop outs.

The objects, advantages and other novel features of the present invention are apparent from the following detailed description when read in conjunction with the appended claims and attached drawing.

DESCRIPTION OF THE PREFERRED EMBODIMENT

Figure 1:
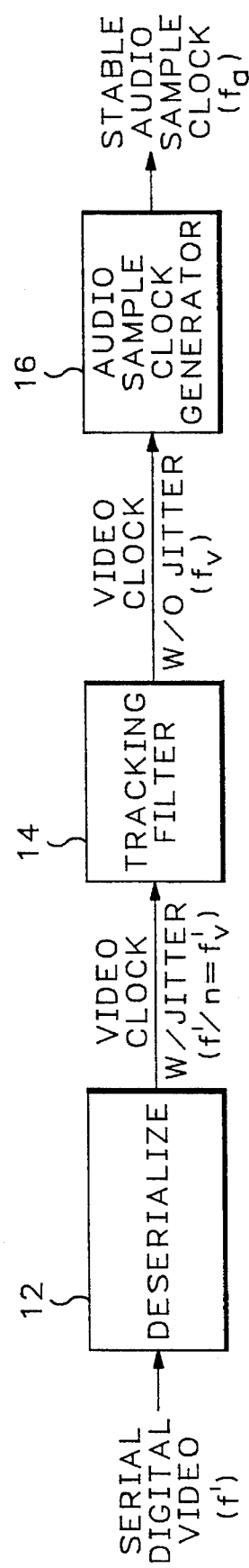
FIG. 1 is a block diagram view of a phase locked loop chain according to the present invention.

Referring now to FIG. 1 a serial digital video signal having a data rate of f', such as 270 MHz, is input to a deserializer 12, such as a SBX1601A Deserializer manufactured by Sony Corporation of Tokyo, Japan. The deserializer 12 converts the serial data from the serial digital video signal into parallel data and recovers from the serial digital video signal a video sample clock $f'_v$ that is 1/n times the data rate f', where n is the number of bits per parallel data word. For 10-bit parallel data words the video sample clock $f'_v$ for a 270 MHz serial digital video signal is 27 Mhz. The "'" after the frequency identifier f indicates that the frequency has clock jitter associated with it. The video sample clock with jitter is input to a tracking filter 14, as described in greater detail below. The tracking filter 14 dejitters the video sample clock to produce a video sample clock without jitter $f_v$. The jitterless video sample clock is then input to an audio sample clock generator 16, such as a Sierra SC11328 Programmable Frequency Synthesizer manufactured by Sierra Semiconductor Corp. of San Jose, Calif., United States of America, to produce a stable audio sample clock $f_a$. The stable audio sample clock is input to a digital to analog converter (DAC) (not shown) to produce an audio signal from the audio data extracted from the serial digital video signal.

Figure 2:
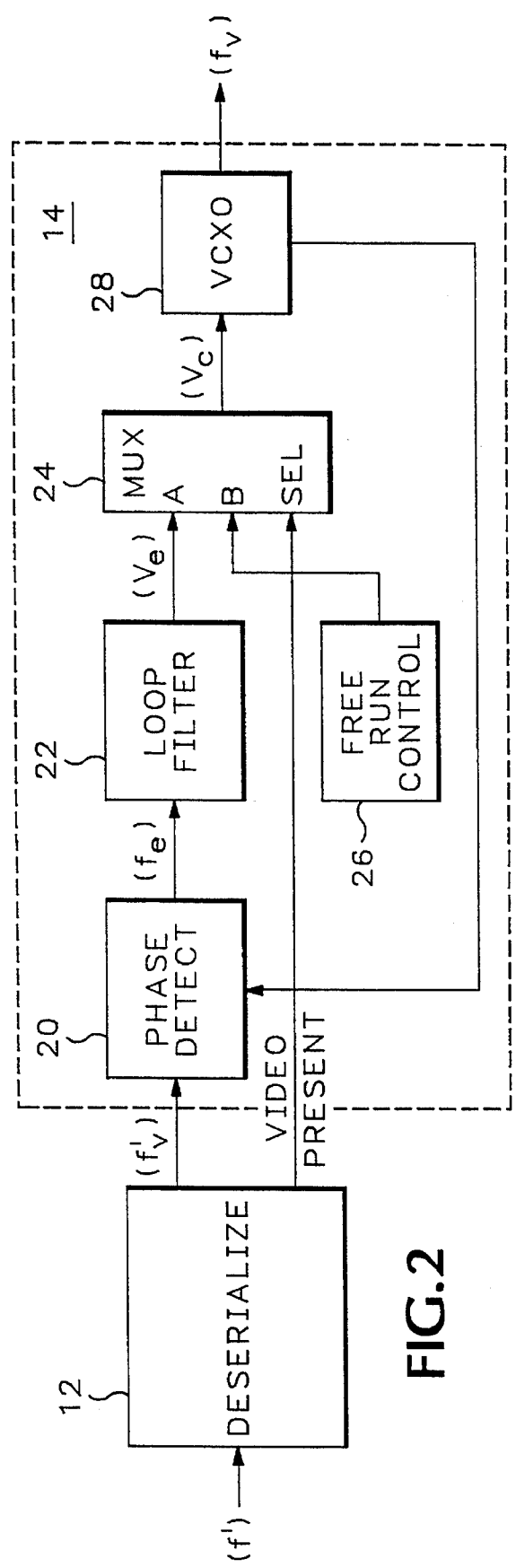
FIG. 2 is a block diagram view of a tracking filter for the phase locked loop chain according to the present invention.

As shown in FIG. 2 the components of the tracking filter 14 include a frequency/phase detector 20, an operational amplifier based integrating loop filter 22, an analog multiplexer 24, an adjustable VCXO voltage reference 26 and a crystal based voltage controlled oscillator (VCXO) 28 in the form of a phase locked loop. The video sample clock with jitter is input to the frequency/phase detector 20 where it is compared with the frequency from the VCXO 28 to generate an error signal $f_e$. The error signal is input to the loop filter 22 where it is integrated over time to produce an error voltage signal $V_e$. The error voltage signal and a reference voltage signal from the adjustable VCXO voltage reference 26 are input to separate inputs of the analog multiplexer 24. A video present signal from the deserializer 12 is applied to the select terminal of the analog multiplexer 24. The output from the analog multiplexer 24 is a voltage control signal $V_c$ that is applied to the control terminal of the VCXO 28 to complete the phase locked loop.

When the tracking filter 14 is locked to the video sample clock from the deserializer 12, the tracking filter acts as a low pass filter on the power spectrum of the video sample clock. Since jitter in the time domain results in sidebands of wideband noise and horizontal rate discrete frequency components, attenuating this sideband spectrum reduces the jitter. The tracking filter 14 may be modeled as a second order linear system with a low pass filter transfer function, as indicated in the article by Andrzej B. Przedpelski entitled "Programmable Calculator Computes PLL Noise, Stability" in Electronic Design, Mar. 31, 1981 (Vol. 29, No. 7), Hayden Publishing Co., Inc. Based on the Laplace transform functions for the frequency/phase detector 20, the loop filter 22 and the VCXO 28, the tracking filter transform function is given by:

$$H(S) = f_v(S)/f_v(S)$$
$$= \{K_dK_v(t_2/t_1) + K_dK_v/t_1\}/\{S^2 + K_dK_vS(t_2/t_1) + K_dK_v/t_1\}$$
$$= \{2D_fw_nS + w_n^2\}/\{S^2 + 2D_fw_nS + w_n^2\}$$

The low pass filter response H(S) is a function of phase detector gain $K_d$, VCXO gain $K_v$, and two loop filter time constants $t_2$ and $t_1$. The denominator of H(S) determines the damping factor $D_f(=t_2w_n/2)$ and the natural frequency $w_n(=$ SQRT$\{K_dK_v/t_1\})$ of the loop, and these two factors also depend upon the two loop gains and filter time constants. Since the forward loop gain $K_d{}^*K_v$ is fixed, the two loop filter time constants are design variables which are determined by the appropriate choice of damping factor and natural frequency.

The optimal choice of damping factor and natural frequency requires knowledge of the jitter power spectral density (JPSD) of both the input clock f' and the free running VCXO 28. The total JSPD seen by the audio clock generator 16 is the sum of the input JSPD weighted by the magnitude squared of the system function, a low pass spectral weighting, and the free running VCXO JPSD weighted by the magnitude squared of the complement of the system function, a high pass spectral weighting. The natural frequency of the loop is chosen to be the frequency where the weighted spectral contributions of each jitter source is equal. Since it is very difficult to measure the JPSD of a very stable crystal oscillator, it is assumed the JPSD of the VCXO 28 is lower than that of the deserializer output clock over all frequencies. The choice of natural frequency and damping factor then reduces to choosing the lowest natural frequency that results in reasonable resistor and capacitor values for the active filter function F(S). The natural frequency is related to the −3 dB frequency and damping factor through the relationship:

$$w_{-3dB}/w_nSQRT\{1+2D_f^2+SQRT\{(1+2D_f^2)^2+1\}\}$$

Now reasonable values of both damping factor and −3 dB frequency are $D_f=2$ and $w_{-3dB}=250$ Hz which results in a natural frequency of $w_n=370$ rad/s. With 1 uF plastic capacitors resistor values of approximately 10 Kohms are realized.

The phase detector 14 may be one that operates like an EX-OR type phase detector when within the lock range and operates like a state machine frequency detector with an "infinite" capture range when outside the lock range, such as the AD9901 Frequency-Phase Detector manufactured by Analog Devices Corp. of Norwood, Mass., United States of America. When locked the output of the phase detector 14 is a square wave with fifty percent (50%) duty cycle. A third pole may be added to the active filter loop 22 to round off the edges of the square wave output, thus allowing the use of a precision, low noise, low bandwidth op-amp in the active loop filter.

In operation when a serial digital video signal is input to the deserializer 12, a video sample clock with jitter and a video present signal are output. The video sample clock is input to the phase detector 20 of the tracking filter 14, and the video present signal is input to the SEL input of the multiplexer 24 so that the output from the loop filter 22 controls the VCXO output frequency. If there is a drop-out of the serial digital video signal, the video present signal also drops out so that the multiplexer 24 selects the precision voltage source 26 as the control signal for the VCXO 28. The tracking filter 14, acting as low pass filter, reduces the clock jitter to below 100 ns peak-to-peak so that the resulting clock signal may be used as a stable reference clock for the audio sample clock generator 16.

Thus the present invention provides a phase locked loop (PLL) chain for locking audio sampling to serial digital component video timing by inserting a crystal controlled, narrowband, phase locked loop between an input video clock with jitter recovered from the serial digital component using a wide bandwidth PLL and a reference clock input to an audio sample clock generator having a wide bandwidth PLL to provide a stable video clock to the reference clock input.

What is claimed is:

1. A phase locked loop chain comprising:
    a first wide bandwidth phase locked loop receiving a serial digital signal with an embedded clock component and recovering from the serial digital signal a first sample clock signal derived from the embedded clock component;
    a tracking filter having as an input the first sample clock signal to produce a stable reference clock signal;
    a second wide bandwidth phase locked loop for receiving the stable reference clock signal and generating a second sample clock signal.

2. The phase locked loop chain as recited in claim 1 wherein the tracking filter comprises a crystal oscillator narrow bandwidth phase locked loop having parameters selected to provide a low pass filter response, the crystal oscillator narrow bandwidth phase locked loop receiving the first sample clock signal and producing the stable reference clock signal.

3. The phase locked loop chain as recited in claim 2 wherein the tracking filter further comprises means for maintaining the stable reference clock signal at the output of the crystal oscillator narrow bandwidth phase locked loop when the first sample clock signal is absent at the input.

4. The phase locked loop chain as recited in claim 2 wherein the crystal oscillator narrow bandwidth phase locked loop comprises:
    a phase detector having as a first input the first sample clock signal and as a second input the stable reference clock signal, and having as an output an error signal;
    a loop filter having as an input the error signal and as an output an error voltage; and
    a stable crystal oscillator having as an input the error voltage and as an output the stable reference clock signal.

5. The phase locked loop chain as recited in claim 4 wherein the crystal oscillator narrow bandwidth phase locked loop further comprises:
    a variable, precision voltage source to provide a reference voltage; and
    a multiplexer having as inputs the error voltage and the reference voltage and as an output a selected one of the two input voltages according to a select signal from the first wide bandwidth phase locked loop, the select signal indicating whether the serial digital signal is present at the input of the first wide bandwidth phase locked loop, and the selected one of the two input signals being input to the crystal oscillator to produce the stable reference clock signal.

* * * * *